United States Patent
Lai et al.

(10) Patent No.: US 8,153,485 B2
(45) Date of Patent: Apr. 10, 2012

(54) METHOD FOR FABRICATING MEMORY (75) Inventors: Erh-Kun Lai, Hsinchu (TW); Chia-Hua Ho, Hsinchu (TW); Kuang-Yeu Hsieh, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/163,769

(22) Filed: Jun. 20, 2011

(65) Prior Publication Data
US 2011/0250729 A1   Oct. 13, 2011

Related U.S. Application Data (62) Division of application No. 11/656,246, filed on Jan. 18, 2007, now Pat. No. 7,989,790.

(51) Int. Cl.
*H01L 21/8238* (2006.01)

(52) U.S. Cl. ............ 438/210; 438/200; 257/2; 257/379; 257/E21.662; 257/E21.663; 257/E21.665; 257/E21.679; 257/E45.002

(58) Field of Classification Search ................ 438/200, 438/210; 257/2, 379, E21.662, E21.663, 257/E21.665, E21.679, E45.002
See application file for complete search history.

(56) References Cited

U.S. PATENT DOCUMENTS
7,161,167 B2 * 1/2007 Johnson ........................ 257/5
* cited by examiner

*Primary Examiner* — Samuel Gebremariam
(74) *Attorney, Agent, or Firm* — Jianq Chyun IP Office (57) ABSTRACT

A method for fabricating a memory is described. Word lines are provided in a first direction. Bit lines are provided in a second direction. A top electrode is formed connecting to a corresponding word line. A bottom electrode is formed connecting to a corresponding bit line. A resistive layer is formed on the bottom electrode. At least two separate L-shaped liners are formed, wherein each L-shaped liner has variable resistive materials on both ends of the L-shaped liner and each L-shaped liner is coupled between the top electrode and the resistive layer.

8 Claims, 7 Drawing Sheets

METHOD FOR FABRICATING MEMORY

CROSS-REFERENCE TO RELATED APPLICATION

This application is a divisional of and claims priority benefit of the application Ser. No. 11/656,246, filed on Jan. 18, 2007, now allowed. The entirety of the above-mentioned patent application is incorporated by reference herein and made a part of this specification.

BACKGROUND OF THE INVENTION

1. Field of the Invention

This invention generally relates to a semiconductor device, and more particularly, to a resistance random access memory ("RRAM") device and method for fabricating the same.

2. Background of the Invention

RRAM is a memory device using materials with variable electrical resistance characteristics in accordance with external influences. Since the resistance will not change even after the power source has been disconnected, RRAM is a non-volatile memory device.

As other memory devices, RRAM includes a number of memory cells, each coupled to a word line and a bit line. A RRAM cell may include a bottom electrode for bit line connection, a top electrode for word line connection, and a resistive film as a variable resistor between the bottom and top electrode. The resistive film may be programmed to have high resistance or low resistance in two-state memory circuits to store one bit of data per cell, or a number of resistance-determined states in multi-state memory circuits to store multiple bits of data in a single cell. In order to have multiple resistance-determined states, the resistive film may need to provide high resistance value so that the memory may have more operation window to perform multi-bit memory operations.

BRIEF SUMMARY OF THE INVENTION

One example consistent with the invention provides a memory which comprises a number of word lines in a first direction, a number of bit lines in a second direction, each coupled to at least one of the word lines, and a number of memory elements, each coupled to one of the word lines and one of the bit lines. Each memory element comprises a top electrode for connecting to a corresponding word line, a bottom electrode for connecting to a corresponding bit line, a resistive layer on the bottom electrode, and at least two separate liners, each liner having resistive materials on both ends of the liner and each liner coupled between the top electrode and the resistive layer.

In another example, a method for fabricating a memory comprises the steps of providing a number of word lines in a first direction, providing a number of bit lines in a second direction, forming a top electrode for connecting to a corresponding word line, forming a bottom electrode for connection a corresponding bit line, forming a resistive layer on the bottom electrode, and forming at least two separate liners, each liner having resistive materials on both ends of the liner and each liner coupled between the top electrode and the resistive layer.

Another example consistent with the invention provides a method for fabricating a memory, which comprises the steps of: providing a number of word lines in a first direction, providing a number of bit lines in a second direction, forming a bottom electrode, depositing an oxide layer on the bottom electrode, forming an insulating layer on the oxide layer, patterning the insulating layer, the oxide layer and the bottom electrode, thereby leaving a portion of the bottom electrode uncovered and sides of the oxide layer exposed, forming two separate liners on the uncovered bottom electrode and along the exposed sides of the oxide layer, forming resistive materials on both ends of each liner, and forming a resistive layer on the uncovered bottom electrode.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended, exemplary drawings. It should be understood, however, that the invention is not limited to the precise arrangements and instrumentalities shown.

In the drawings.

DETAILED DESCRIPTION OF THE INVENTION

Figure 1:
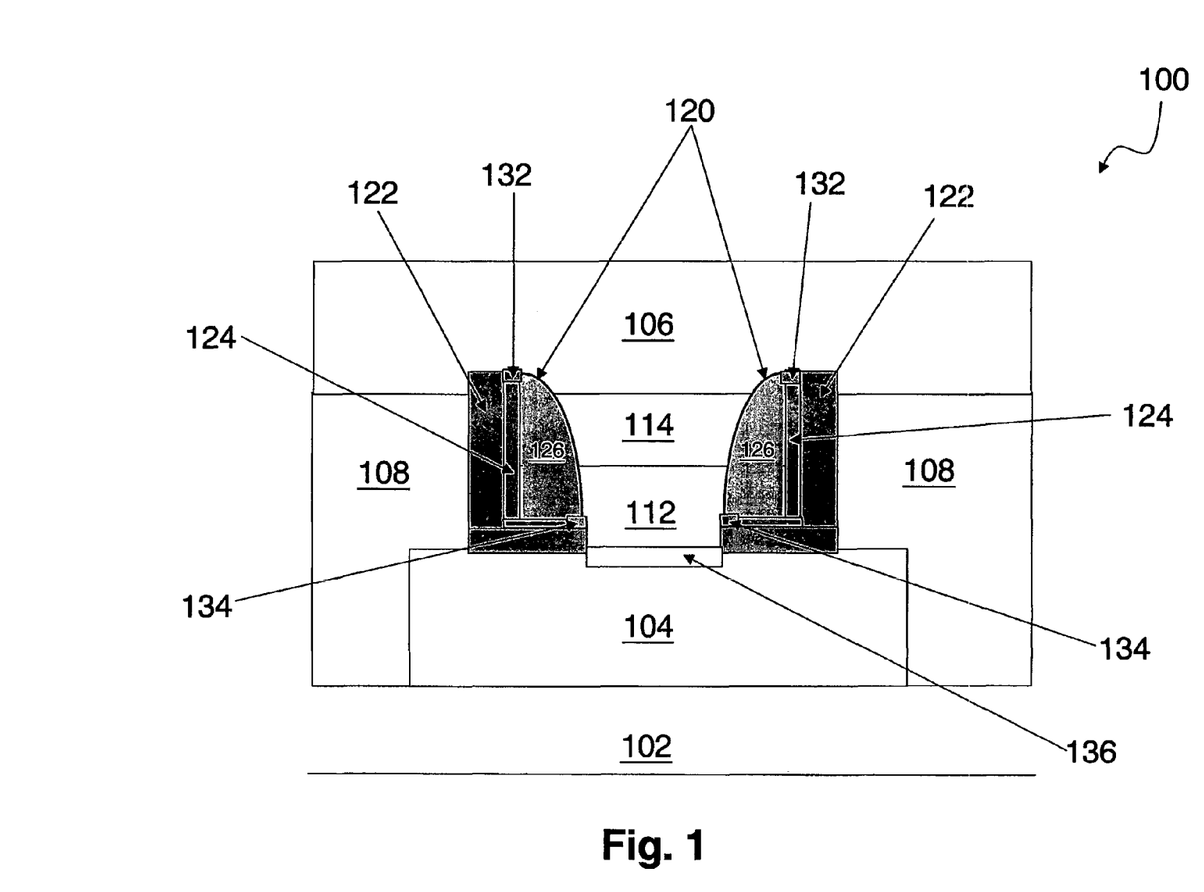
FIG. 1 is a cross-sectional view of one exemplary memory cell in accordance of the present invention.

Referring to FIG. 1, a memory cell 100 may be formed on an integrated circuit substrate 102. The memory 100 may include a bottom electrode 104 and a top electrode 106. A resistive layer 136 is formed on portions of the bottom electrode 104. Between the bottom electrode 104 and top electrode 106, there are an oxide layer 108 and a resistive structure. The resistive structure may include two L-shaped liners 120 separated by an oxide layer 114 and a layer 112 of metal or metal oxide materials. Each L-shaped liner 120 may include a first oxide liner 122, a metal liner 124, as well as a second oxide liner 126. The metal liner 124 for each L-shaped liner 120 has two resistive ends 132 and 134. Each resistive end 132 or 134 is made of either the same or different resistive materials.

Resistive materials may include chalcogenide alloy material, magnetroresistive materials, and polymer materials. Chalcogenide alloy materials may change between the crystalline and amorphous states with application of heat. Under high temperature, over 600° C. for example, the chalcogenide becomes liquid. Once cooled, it is frozen into an amorphous glass-like state and its electrical resistance is high. On the other hands, by heating the chalcogenide to a temperature between its crystallization point and its melting point, it may transform into a crystalline state with a much lower resistance. Since the crystalline and amorphous states of chalcogenide alloy materials may be distinguished in accordance with their different electrical resistivity values, this forms the basis by which data is stored. For example, the amorphous, high resistance state may be used to represent a binary 1, and the crystalline, low resistance state represents a binary 0. Chalcogenide alloy materials may be made of a mixture of germanium, antimony and tellurium called, GST. Chalcogenide alloy materials may be deposited by physical vapor deposition (PVD) sputtering or magnetron-sputtering method with reactive gases, such as Ar, $N_2$, or He, at pressure of 1 mTorr to 100 mTorr. The deposition may be performed at room temperature. The collimator with aspect ratio of 1 to 5 may be used to improve the fill-in performance. In addition, to improve the fill-in performance, the DC bias of tens of volts to hundreds of volts may also be used. The post deposition annealing treatment with vacuum or $N_2$ ambient, may improve the crystallize state of chalcogenide alloy materials. The temperature for annealing treatment may range from 100° C. to 400° C. with time of less than 30 minutes.

Magnetoresistive materials may have variable magnetization directions with application of a magnetic field. Due to the magnetic tunnel effect, the electrical resistance of the magnetoresistive materials changes depending on the magnetization direction. Therefore, memory cells using such materials may store data by the magnetization states and the data stored therein can be sensed by measuring the electrical resistance of the cells. Magnetoresistive materials may include colossal magneto resistive ("CMR") thin films and oxidation thin films having Perovskite structure. CMR thin films may be formed by PVD sputtering or magnetron-sputtering method with reactive gases, such as Ar, $N_2$, $O_2$ or He at the pressure of 1 mTorr to 100 mTorr. The deposition temperature may range from room temperature to 600° C., depending on the post deposition treatment condition. The collimator with aspect ratio of 1 to 5 may improve the fill-in performance. In addition, the DC bias of tens of volts to hundreds of volts may also be used to improve the fill-in performance. Further, a magnetic field of tens of gauss to Tesla may be applied to improve the magnetic crystallize state. The post deposition annealing treatment with vacuum or $N_2$ ambient or $O_2/N_2$ mixed ambient may improve the crystallize state of CMR materials. In addition, a buffer layer of $YBaCuO_3$ with thickness of 30 nm to 200 nm may be deposited before deposition of CMR materials to improve the crystallize of CMR materials. Similarly, the oxidation thin films having Perovskite structure may be deposited by same method discussed above or formed by oxidation discussed below.

Polymer materials may have variable polarization states with application of an electric field. Since the electrical resistance of a polymer changes in accordance with the orientation of polarization of the polymer, the data stored in memory cells using polymer materials can be sensed by measuring the electrical resistance of the cells. Polymer materials may include tetracyanoquinodimethane (TCNQ) or PCBM [[6,6]-phenyl C61-butyric acid methyl ester]. Polymer materials may be formed by thermal evaporation, e-beam evaporation or MBE evaporation. A solid-state TCNQ and dopant pellets are co-evaporated in a single chamber where materials are mixed and deposited on wafers. There may be no reactive chemistries or gases. The deposition may be performed at pressure of $10^{-4}$ Torr to $10^{-10}$ Torr. The wafer temperature may range from room temperature to 200° C. The post deposition annealing treatment with vacuum or $N_2$ ambient may improve the composition of polymer materials. The temperature for the annealing treatment may range from room temperature to 300° C. with time less than 1 hour. In addition, polymer materials may be formed by spin coating of the doped TCNQ solution with rotation of less than 100 rpm.

Figure 2:
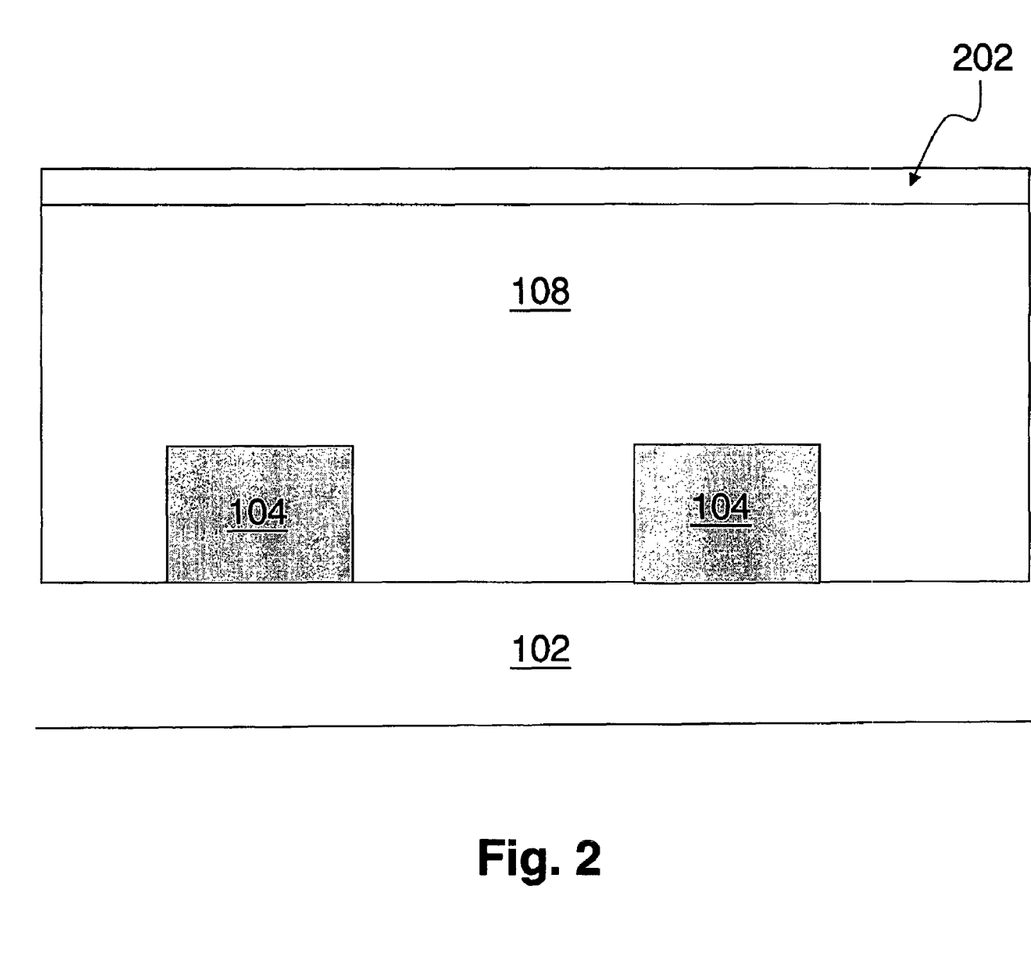
FIG. 2 is a sectional view of a memory cell in FIG. 1 showing an exemplary manufacturing method according to the present invention.
Figure 3:
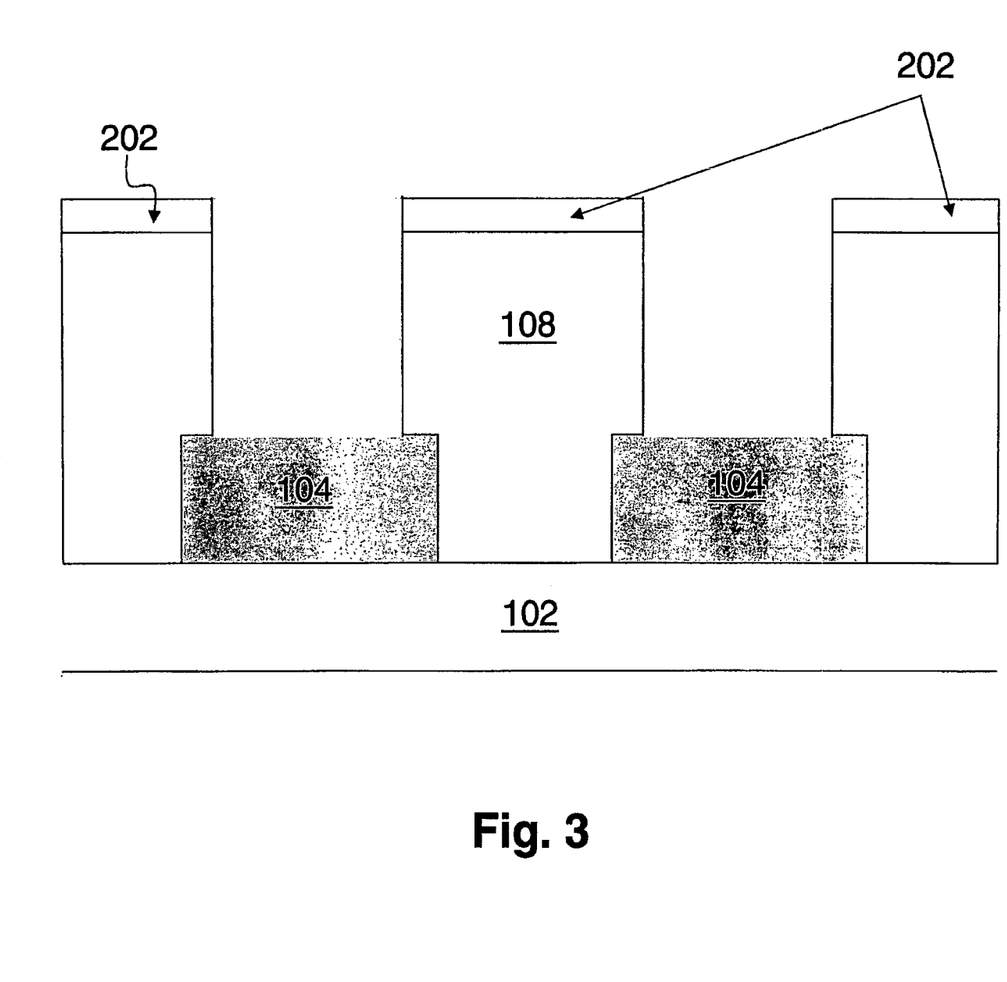
FIG. 3 a sectional view of a memory cell in FIG. 1 showing an exemplary manufacturing method according to the present invention.

FIGS. 2-7 are sectional views of a non-volatile memory cell showing an exemplary method of fabricating a memory cell of FIG. 1. Referring to FIG. 2, conductive materials are deposited on a substrate 102 and patterned to form bottom electrodes 104 for bit line connection. In one example, the conductive materials are metals that may be subject to oxidation, such as Al, W, Ti, Ni or Cu. Inter-metal dielectric deposition is then performed to overlay bottom electrodes 104 with a layer of oxide 108 by chemical mechanical planarization. An insulating material 202, such as silicon nitride in one example, is subsequently formed on the oxide layer 108. The structure of FIG. 2 is patterned by vaporization to form the structure of FIG. 3 where portions of the bottom electrodes 104 are uncovered and side of the oxide layer 108 are exposed.

Figure 4:
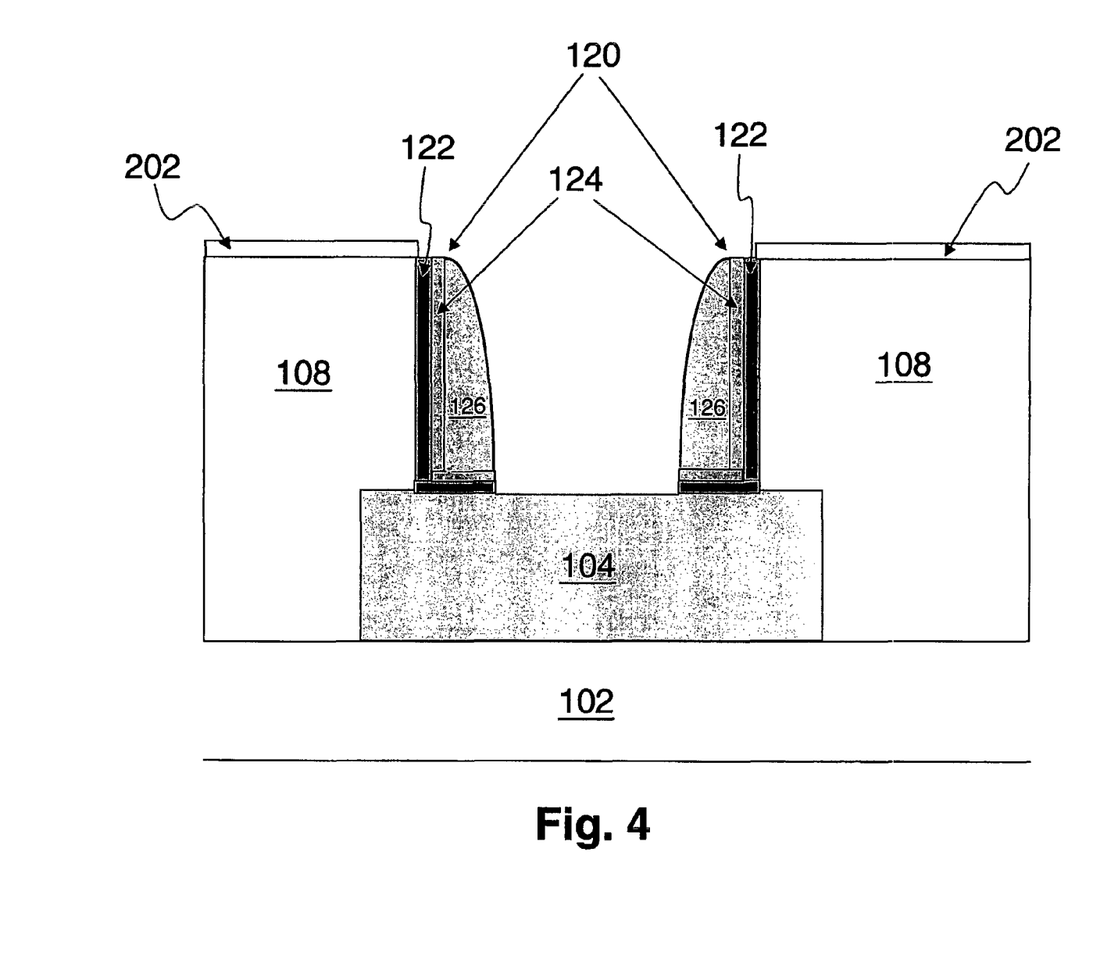
FIG. 4 is a sectional view of a memory cell in FIG. 1 showing an exemplary manufacturing method according to the present invention.

Referring to FIG. 4, an oxide liner 122 is formed on the uncovered bottom electrode 104 and along the exposed sides of the oxide layer 108 by oxide liner deposition. Following that, a metal liner deposition is performed to form a metal liner 124 on the oxide liner 122. In one example, the metal liner is made of metals that may be subject to oxidation, such as Al, W, Ti, Ni or Cu. A second oxide liner 126 is then formed on the metal liner 124 by another oxide liner deposition. Subsequently, vaporization for blanket etching is performed to form the structure of the L-shaped liner 120.

Figure 5:
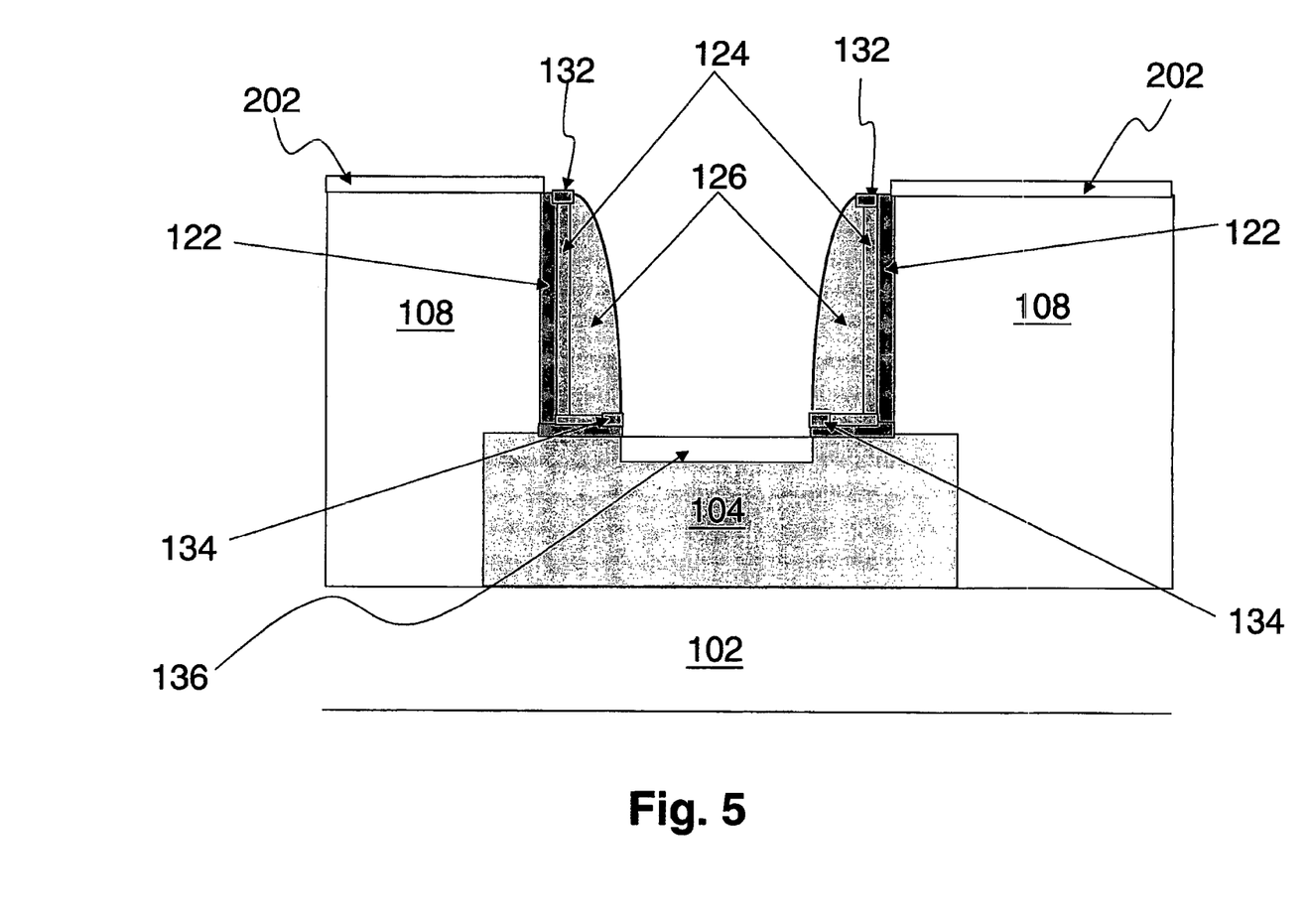
FIG. 5 is a sectional view of a memory cell in FIG. 1 showing an exemplary manufacturing method according to the present invention.

Referring to FIG. 5, resistive materials are formed on both ends of each metal liner 124 as well as on the uncovered portion of the bottom electrode 104. In one example where the metal liner 124 and the bottom electrode 104 are made of metals that are subject to oxidation, the surface of metal may be oxidized to form metal oxides, at both ends 132 and 134, and a metal oxide layer 136 on the uncovered bottom electrode 104. Oxidation may be done by, for example, thermal oxidation having temperature ranging from 200° C. to 700° C. with pure $O_2$ or $N_2/O_2$ mixed gas at pressure of several mTorr to 1 atmosphere. Another example of oxidation is plasma oxidation where an RF or DC source plasma with pure $O_2$ or $Ar/O_2$ mixed gas or $Ar/N_2/O_2$ mixed gas with pressure of 1 mTorr to 100 mTorr may be used to oxidize the surface of metal. The oxidation temperature may range from room temperature to 300° C. depending on the degree of plasma oxidation.

Figure 6:
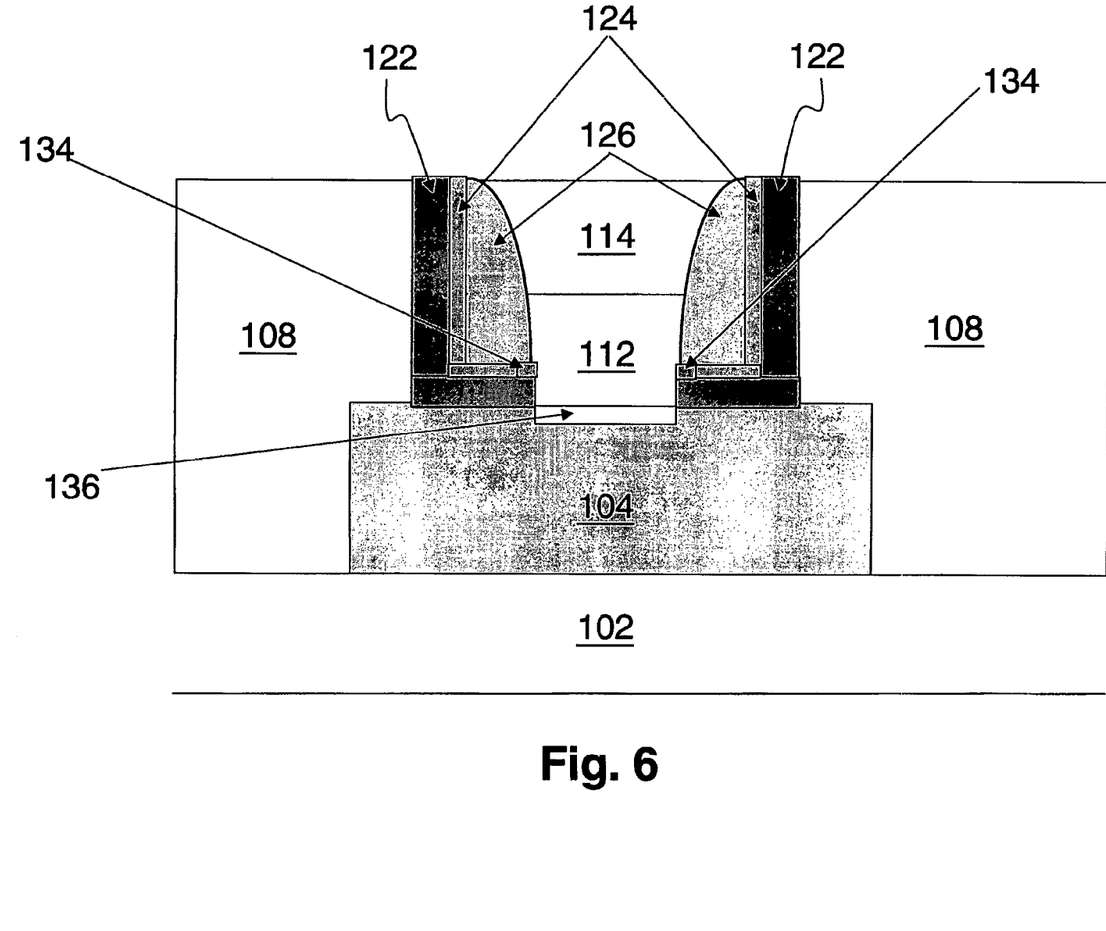
FIG. 6 is a sectional view of a memory cell in FIG. 1 showing an exemplary manufacturing method according to the present invention.

Referring to FIG. 6, a layer 112 of either metal or metal oxides is deposited on the metal oxide layer 136. A layer 114 of oxide is then formed on the layer 112 by chemical mechanical planarization. Following that, the insulating layer 122 and the resistive end 132 of the metal liner 124 may be removed by conventional oxide CMP (planarize layer 114, an oxide layer, then removed layer 124).

Figure 7:
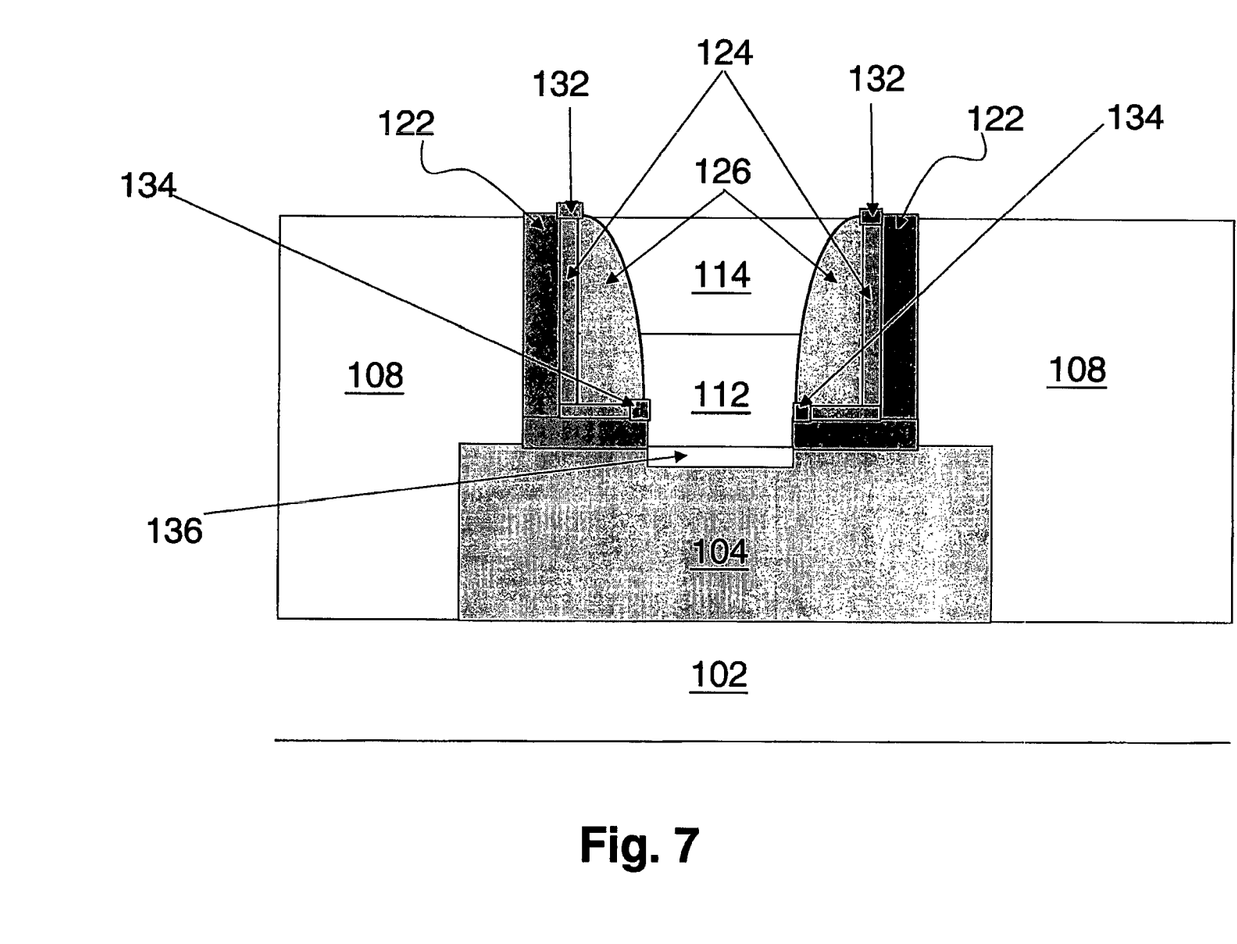
FIG. 7 is a sectional view of a memory cell in FIG. 1 showing an exemplary manufacturing method according to the present invention.

Referring to FIG. 7, oxidation may be performed again to form metal oxides at the ends 132 of each metal liner 124. By oxidation in different environment, the characteristics of the metal oxides at the ends 132 may be different from those of the metal oxides at the ends 134. Then, a conductive material such as metal materials may be deposited on the structure of FIG. 7 for word line connection to form the structure of FIG. 1.

With the structure of FIG. 1, each of the resistive ends 132 and 134 forms a resistor (R132, R134) which may provide high resistance due to its small area. The resistors R132 and R134 are connected in series, which are together connected in parallel with the other pair of the resistors R132 and R134. In addition, the resistive layer 136 also forms a resistor R136 in series with combination of the resistors R132 and R134. In the case where the layer 112 is made of resistive materials, the layer 112 may also provide a resistor R112 which is connected in series between resistor R136 and combination of the resistors R132 and R134. Since the resistance ends 132 and 134 have very small area, they may provide high resistance, thus resulting in more operation window to perform multi-bit memory reading and writing operations.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A method for fabricating a memory, comprising:
   providing a number of word lines in a first direction;
   providing a number of bit lines in a second direction;
   forming a top electrode for connecting to a corresponding word line;
   forming a bottom electrode for connecting to a corresponding bit line;
   forming a resistive layer on the bottom electrode; and
   forming at least two separate L-shaped liners, each L-shaped liner having variable resistive materials on both ends of the L-shaped liner and each L-shaped liner being coupled between the top electrode and the resistive layer.

2. The method of claim 1, wherein the step of forming the L-shaped liners comprises:
   performing a first oxide liner deposition on the uncovered portion of the bottom electrode to form a first oxide liner;
   performing a metal liner deposition on the first oxide liner to form a metal liner;
   performing a second oxide liner deposition on the metal liner to form a second oxide liner; and
   performing blanket etching on the first oxide liner, the metal liner and the second oxide liner to form the liners in L-shape.

3. A method for fabricating a memory, comprising:
   providing a number of word lines in a first direction;
   providing a number of bit lines in a second direction;
   forming a bottom electrode;
   depositing an oxide layer on the bottom electrode;
   forming an insulating layer on the oxide layer;
   patterning the insulating layer, the oxide layer and the bottom electrode, thereby leaving a portion of the bottom electrode uncovered and sides of the oxide layer exposed;
   forming two separate L-shaped liners on the uncovered bottom electrodes and along the exposed sides of the oxide layer;
   forming resistive materials on both ends of each L-shaped liner; and
   forming a resistive layer on the uncovered bottom electrode.

4. The method of claim 3, wherein the step of forming the L-shaped liners comprises:
   performing a first oxide liner deposition on the uncovered portion of the bottom electrode to form a first oxide liner;
   performing a metal liner deposition on the first oxide liner to form a metal liner;
   performing a second oxide liner deposition on the metal liner to form a second oxide liner; and
   performing blanket etching on the first oxide liner, the metal liner and the second oxide liner to form the L-shaped liners.

5. The method of claim 3 further comprising a step of forming a metal layer on the resistive layer.

6. The method of claim 3 further comprising a step of forming a second resistive layer on the resistive layer.

7. The method of claim 3, wherein the steps of forming the resistive materials on both ends of each L-shaped liner comprises:
   performing a first oxidation to form resistive materials on both ends of each L-shaped liner;
   performing chemical mechanical planarization to remove the insulating layer and the resistive materials on a first end of each L-shaped liner; and
   performing a second oxidation to form resistive materials on the first end of each L-shaped liner.

8. The method of claim 3 further comprising a step of forming a top electrode on the L-shaped liners.

* * * * *